(12) United States Patent
Yuan et al.

(10) Patent No.: US 11,323,115 B1
(45) Date of Patent: May 3, 2022

(54) HIGH-SPEED MULTIPLEXER

(71) Applicant: Cadence Design Systems, Inc., San Jose, CA (US)

(72) Inventors: Xiaobin Yuan, Cary, NC (US);
Dimitrios Loizos, Sunnyvale, CA (US);
Varun Joshi, Chapel Hill, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/316,069

(22) Filed: May 10, 2021

(51) Int. Cl.
| | |
|---|---|
| *H03K 17/735* | (2006.01) |
| *H03K 17/64* | (2006.01) |
| *H03K 17/693* | (2006.01) |
| *H03K 17/687* | (2006.01) |

(52) U.S. Cl.
CPC ........... *H03K 17/735* (2013.01); *H03K 17/64* (2013.01); *H03K 17/693* (2013.01); *H03K 2017/6878* (2013.01)

(58) Field of Classification Search
CPC .... H03K 17/735; H03K 17/64; H03K 17/693; H03K 2017/6878
USPC ....................................................... 327/408
See application file for complete search history.

(56) References Cited

U.S. PATENT DOCUMENTS

| | | | |
|---|---|---|---|
| 2007/0018694 A1* | 1/2007 | Chen | H03K 19/09432 326/115 |
| 2017/0134009 A1* | 5/2017 | Namkoong | H03K 3/01 |

* cited by examiner

*Primary Examiner* — Tomi Skibinski

(74) *Attorney, Agent, or Firm* — Schwegman Lundberg & Woessner, P.A.

(57) ABSTRACT

A high-speed multiplexor comprises a set of differential input pairs to receive and mix a set of differential input signals at a differential output node pair. The high-speed multiplexer further comprises an active inductive load pair driven by the input stage using the mixed set of differential input signals. Each active inductive load comprises a p-channel field effect transistor (pFET) device connected to one of the differential output node pairs and a resistor connected between a gate node and a drain node of the pFET device. The multiplexer further comprises a first cross-coupling capacitor connected between the gate node of a first inductive load and a second output node of the differential output node pair and a second cross-coupling capacitor connected between the gate node of a second inductive load and a first output node of the differential output node pair.

19 Claims, 4 Drawing Sheets

HIGH-SPEED MULTIPLEXER

TECHNICAL FIELD

The present disclosure generally relates to integrated circuits (ICs). In particular, the present disclosure addresses a high-speed multiplexer.

BACKGROUND

A multiplexer is an IC device that selects between multiple input signals and provides the selected input signal to a single output line. The signal selected by a multiplexer is based on a selection signal received at a set of select lines of the multiplexer. As an example, a multiplexer with 2" inputs has n select lines, which are used to select an input signal to provide at the output. A multiplexer allows multiple input signals to share one device or resource (e.g., one analog-to-digital converter or one communications transmission medium) instead of having one device per input signal. In high-speed serial communication, a multiplexer can be used in the final stages of a transmitter to multiplex transmission signals over a single communication lane.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, in an example implementation, a multiplexer can be used in the final stages of high-speed serial communication. Many high-speed serial communication systems have strict transmitter bandwidth requirements to minimize inter-symbol interference (ISI) in the transmitted data. Because the final stages of a serial transmitter (e.g., a final multiplexor and a driver) operate at the highest speed (e.g., 56 GBs), it is desirable to have a combined bandwidth beyond the Nyquist frequency (e.g., 28 GHz) through these stages.

Aspects of the present disclosure address the forgoing issues in high-speed serial communication, by providing a high-speed multiplexer that provides optimal equalization to offset loss through the transmitter datapath. When combined with a driver in the final stages of a serial transmitter, the high-speed multiplexor helps to extend the overall bandwidth of the transmitter and significantly reduces the ISI induced jitter at the driver output.

Figure 1:
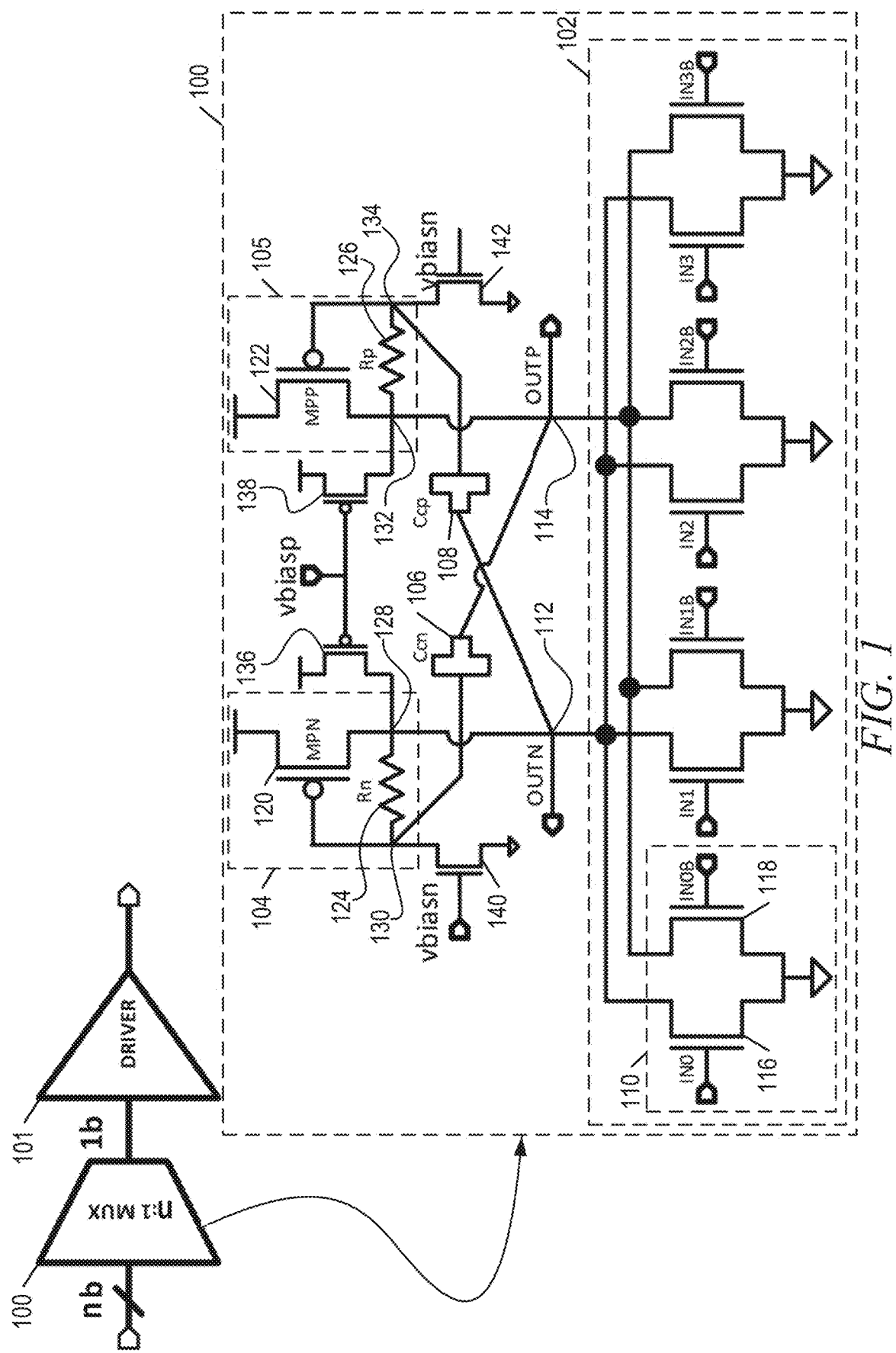
FIG. 1 is a circuit diagram illustrating a high-speed multiplexer, according to some example embodiments.

With reference to FIG. 1, a high-speed multiplexer 100 is illustrated. In example implementations in which the high-speed multiplexor is used in a final stage of a high-speed transmitter, the high-speed multiplexer 100 is connected at its output to a driver 101, as shown. The high-speed multiplexer 100 comprises an input stage 102, an active inductive load pair comprising active inductive loads 104 and 105, and cross-coupling capacitors 106 and 108.

The input stage 102 comprises a set of differential input pairs 110 to receive multiple differential input signals (e.g., pulses) and mix the multiple differential input signals into a single differential output signal (e.g., a bit-stream) provided at a differential output node pair comprising output nodes 112 and 114. Each differential input pair 110 includes two inputs and two outputs. An input signal is received at a first input of the differential input pair 110 and an inverse of the input signal is received at a second input of the differential pair. A first output of each differential input pair 110 is connected to the output node 112 and a second output of each differential input pair 110 is connected to the output node 114. That is, the input stage 102 includes a first set of outputs connected to the output node 112 and a second set of outputs connected to the output node 114.

Each differential input pair 110 can comprise a pair of transistor devices. For example, as shown, a differential input pair 110 can comprise an n-channel field effect transistor (nFET) device 116 and nFET device 118. The nFET devices 116 and 118 are connected at their source to a common ground. An input signal (e.g., "IN0") is received at the gate of nFET device 116 and an inverse of the input signal (e.g., "IN0B") is received at the gate of the nFET device 118. The drain of the nFET device 116 is connected to the output node 112 and the drain of the nFET device 118 is connected to the output node 114.

The active inductive loads 104 and 105 provide optimal equalization to extend bandwidth at the driver 101 output. The active inductive load 104 comprises a p-channel field effect transistor (pFET) device 120 and resistor 124 and the active inductive load 104 comprises pFET device 122 and resistor 126. The pFET device 120 is connected to drain node 128 at its drain, to gate node 130 at its gate, and to ground at its source. The resistor 124 is connected between the gate node 130 and the drain node 128. The drain node 128 is connected to the output node 112. The pFET device 122 is connected to drain node 132 at its drain, to gate node 134 at its gate, and to ground at its source. The resistor 126 is connected between the gate node 134 and the drain node 132. The drain node 132 is connected to the output node 114.

As shown, a pair of capacitors are used to cross-couple the pair of active inductive loads, thereby creating a cross-coupled pair at high frequencies to further increase gain and equalization at the Nyquist frequency for the multiplexer 100. More specifically, the capacitor 106 is cross-coupled between the gate node 130 and the output node 114. The capacitor 108 is cross-coupled between the gate node 134 and the output node 112. The cross-coupling capacitors 106 and 108 provide a positive feedback path through the pFET devices 120 and 122, respectively, to enhance pullup or pulldown at high frequency. Small-signal wise, the cross-coupling capacitors 106 and 108 increase peaking at the Nyquist frequency by decreasing the damping ratio, as discussed below.

As shown, the multiplexer 100 further includes bias control elements 136, 138, 140, and 142. Bias control elements 136 and 138 are pFET devices that receive a first bias voltage (vbiasp) at a common gate node connected to their gates. The drain of the bias control element 136 is connected to the drain of the pFET device 120 and the drain of the bias control element 138 is connected to the drain of pFET device 122. The bias control elements 140 and 142 are nFET devices that receive a second bias voltage at their gates and are connected to a common ground and their source. The drain of the bias control element 140 is connected to the gate node 130 and the drain of the bias control element 142 is connected to the gate node 134.

To avoid obscuring the inventive subject matter with unnecessary detail, various functional components that are not germane to conveying an understanding of the inventive subject matter have been omitted from FIG. 1. However, a skilled artisan will readily recognize that various additional functional components may be included as part of the multiplexer 100 to facilitate additional functionality that is not specifically described herein.

Figure 2:
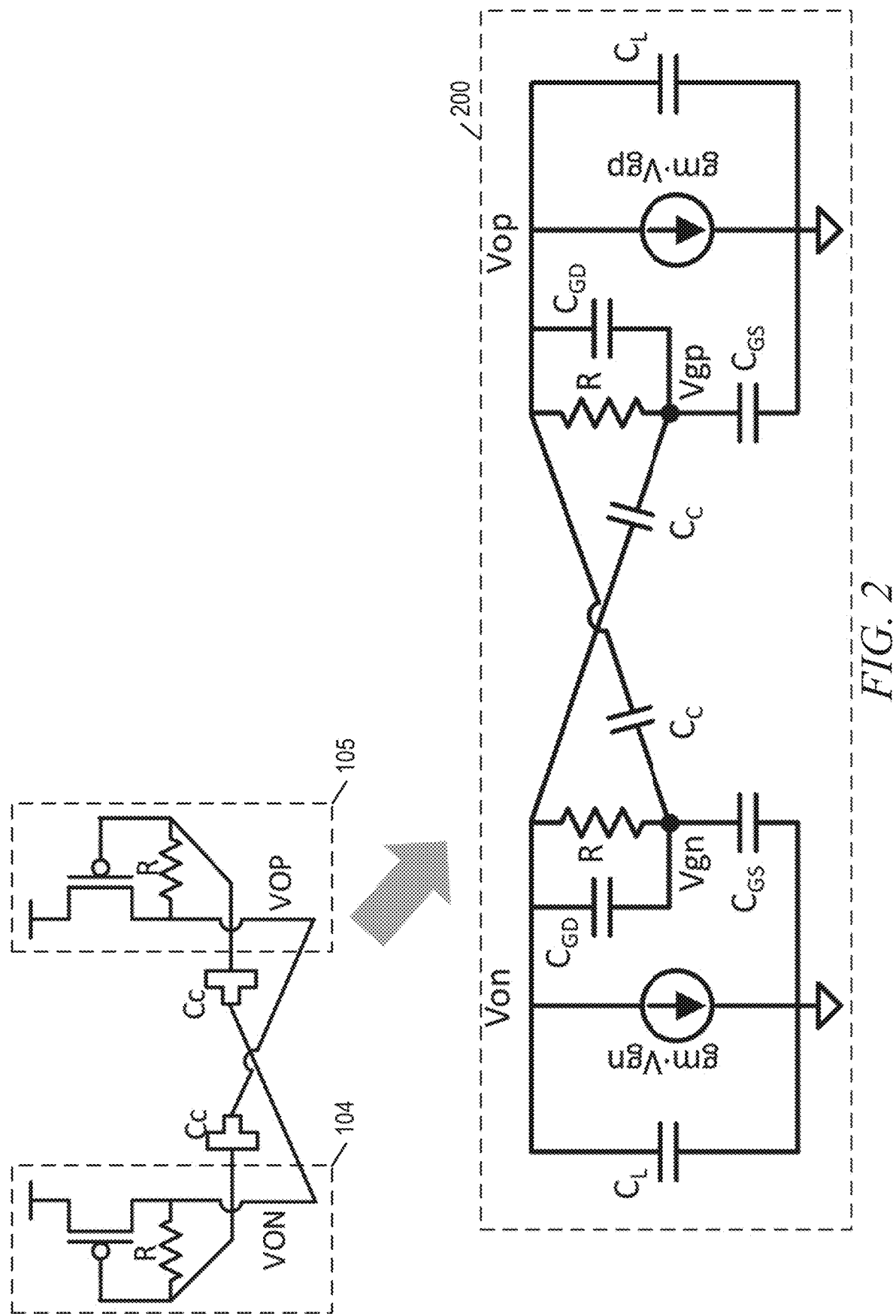
FIG. 2 is a circuit diagram illustrating an equivalent circuit for cross-coupled active inductive load pair, which forms part of the high-speed multiplexer, according to some example embodiments.

With reference to FIG. 2, an equivalent circuit 200 for the cross-coupled active inductive loads 104 and 105 is shown, according to some example embodiments. In FIG. 2, $C_L$ is the load on output nodes 112 and 114; $C_{GS}$ is the gate-source capacitance; $C_{GD}$ is the gate-drain capacitance; gm is the transconductance of pFET devices 120 and 122; $C_c$ is the capacitance of the capacitors 106 and 108; and Vgn/p is the voltage at the gate nodes of the pFET devices 120 and 122. With Vop set to 0, Vgn/p can be expressed as follows:

$$Vgn_{vop=0} = \frac{(1 + R \cdot C_{GD} \cdot S) \cdot Von}{1 + R \cdot S \cdot (C_{GS} + C_{GD} + C_C)}$$

With Von set to 0, Vgn/p can be expressed as follows:

$$Vgn_{von=0} = \frac{R \cdot C_C \cdot S \cdot Vop}{1 + R \cdot S \cdot (C_{GS} + C_{GD} + C_C)}$$

As Von=−Vop, the total voltage expression for Vgn can be rewritten as follows:

$$Vgn = \frac{(1 + R \cdot C_{GD} \cdot S - R \cdot C_C \cdot S) \cdot Von}{1 + R \cdot S \cdot (C_{GS} + C_{GD} + C_C)}$$

The total current on the Von node can be expressed as follows:

$$Ion = Vgn \cdot gm + Von \cdot S \cdot C_L + \frac{(Von - Vgn) \cdot (1 + R \cdot S \cdot C_{GD})}{R} + (Von - Vgp) \cdot S \cdot C_C$$

Given that Vgp=−Vgn, the expression can be rewritten as follows:

$$Ion = Vgn \cdot gm + Von \cdot S \cdot C_L + \frac{(Von - Vgn) \cdot (1 + R \cdot S \cdot C_{GD})}{R} + (Von + Vgn) \cdot S \cdot C_C$$

In view of the above, the single-ended impendence of the active inductive load 104 (which is equivalent to the impendence of the active inductive load 105) can be expressed as follows:

$$Z = \frac{Von}{Ion} = \frac{(1 + R \cdot (C_{GD} + C_{GS} + C_C) \cdot S)}{(R \cdot [C_L \cdot (C_{GD} + C_{GS} + C_C) + C_{GD} \cdot C_{GS} + C_C \cdot (4 \cdot C_{GD} + C_{GS})] \cdot S^2 + [gm \cdot R \cdot (C_{GD} - C_C) + (C_L + C_{GS} + 4 \cdot C_C)] \cdot S + gm)}$$

Hence, when $C_L$ and $C_C$=0, the impendence reduces to the classic Wu active inductor:

$$Z = \frac{1 + R \cdot (C_{GD} + C_{GS}) \cdot S}{(1 + R \cdot C_{GD} \cdot S) \cdot (C_{GS} \cdot S + gm)}$$

Figure 3:
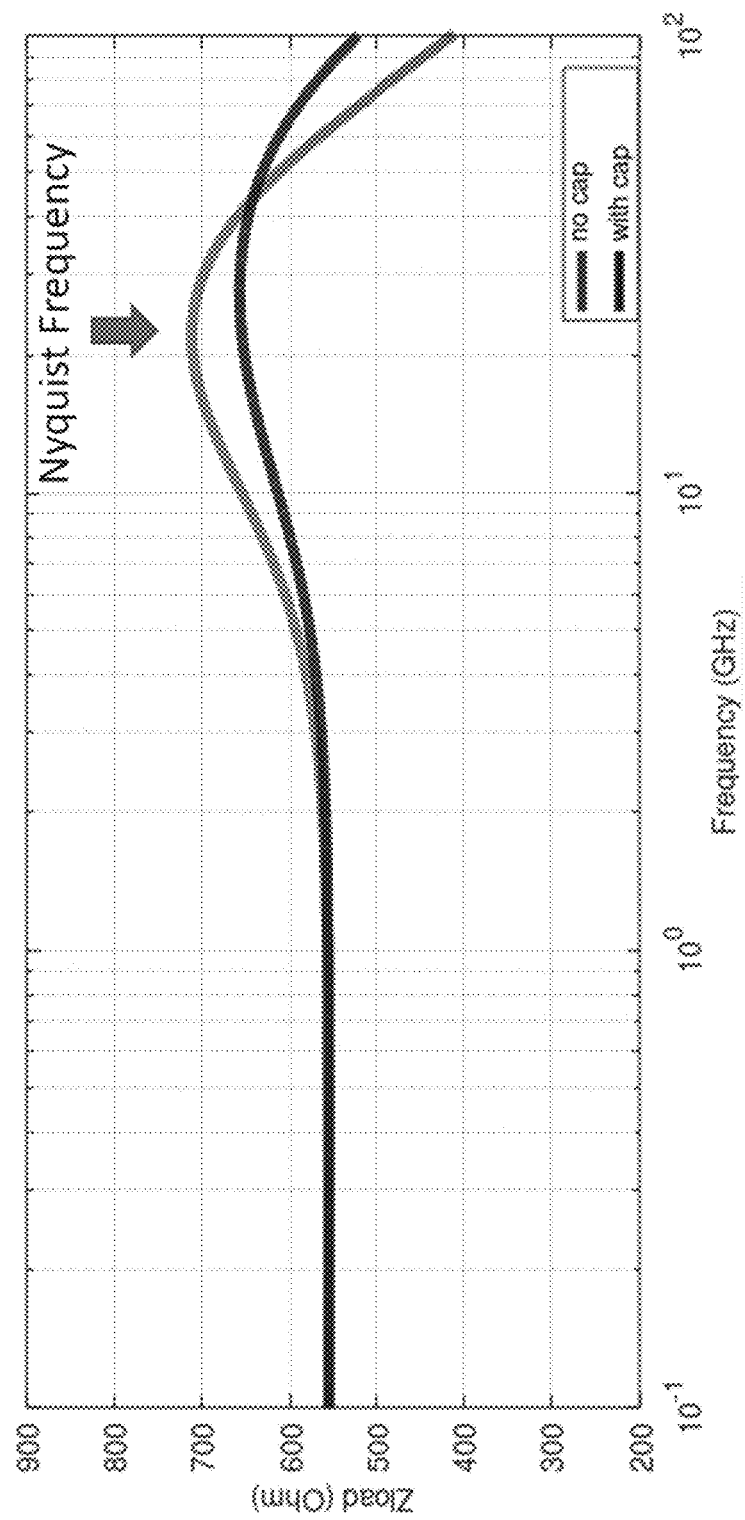
FIG. 3 is a graph illustrating a frequency response of the cross-coupled active inductive load pair within the high-speed multiplexer, according to some example embodiments.

FIG. 3 is a graph 300 illustrating a frequency response of the high-speed multiplexer, according to some example embodiments. As shown, the cross-coupling capacitors 106 and 108 provide a positive feedback path through the pFET devices 120 and 122 that can enhance pullup or pulldown for the differential output signal at high frequencies. Small-signal wise, the cross-coupling capacitors 106 and 108 increase peaking at the Nyquist frequency by decreasing the damping ratio (ζ) of the second-order function for the impedance, as shown in the following expression:

$$\zeta = \frac{gm \cdot R \cdot C_{GD} + C_{GS} + C_L - (gm \cdot R - 4) \cdot C_C}{2 \cdot}$$

In addition, as shown in the following expression, the natural frequency ($\omega_n$) decreases as $C_C$ increases:

$$\omega_n = \sqrt{\frac{gm}{R \cdot [C_L \cdot (C_{GD} + C_{GS} + C_C) + C_{GD} \cdot C_{GS} + C_C \cdot (4 \cdot C_{GD} + C_{GS})]}}$$

Hence, an optimal value for this capacitance can provide the combination of the multiplexer 100 and driver 101 with an optimum bandwidth and equalization.

Figure 4:
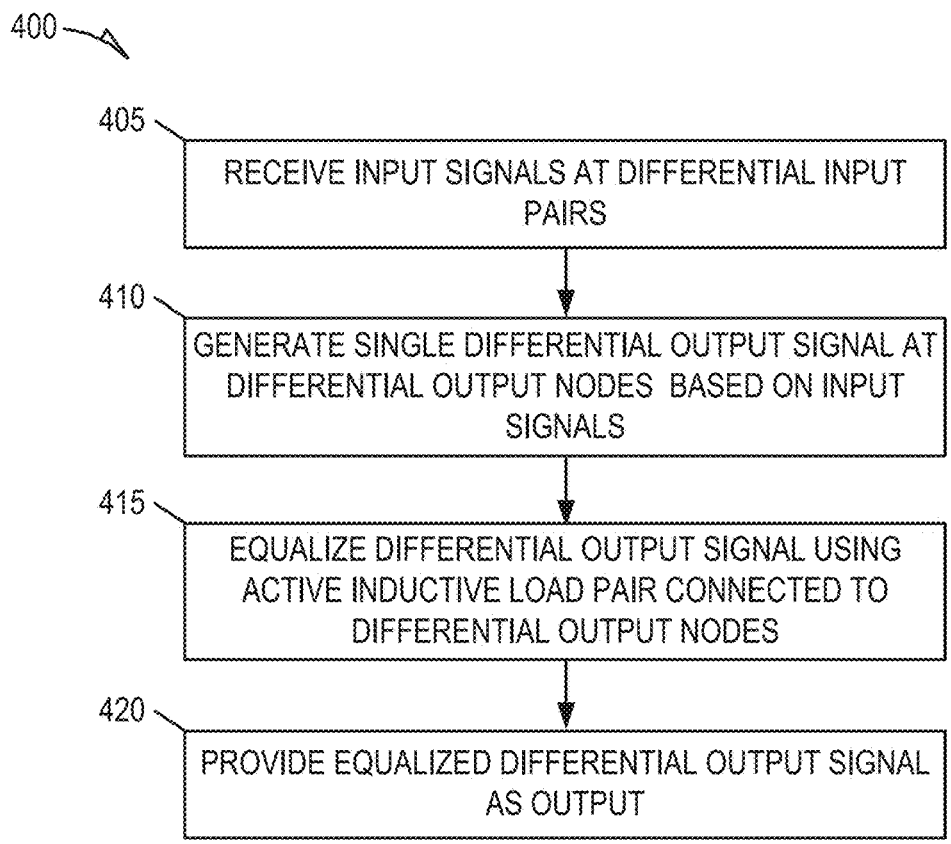
FIG. 4 is a flow diagram illustrating operations of the high-speed multiplexer in performing a method of signal multiplexing, according to some example embodiments

FIG. 4 is a flow diagram illustrating operations of the high-speed multiplexer 100 in performing a method 400 of signal multiplexing, according to some example embodiments. Depending on the embodiment, an operation of the method 400 may be repeated in different ways or involve intervening operations not shown. Though the operations of the method 400 may be depicted and described in a certain order, the order in which the operations are performed may vary among embodiments, including performing certain operations in parallel.

The set of differential input pairs 110 in the input stage 102 of the high-speed multiplexer 100 receive a set of differential input signals (e.g., pulses) (operation 405). The set of differential input pairs 110 generate a single differential output signal at the differential output nodes 112 and 114 based on the set of differential input signals. The set of differential input pairs 110 generates the single differential output signal by combining (e.g., mixing) the set of differential input signals (operation 410). That is, the set of differential input pairs 110 converts the set of differential input signals into a single differential output signal at the differential output nodes 112 and 114. The set of differential input pairs 110 use the differential output signal to drive a cross-couple active inductive load pair (comprising active inductive loads 104 and 105) connected to the differential output nodes 112 and 114 to equalize the differential output signal (operation 415). The cross-coupled active inductive loads 104 and 105 perform an optimal amount of equalization to extend the bandwidth at the output of the driver 101. In addition, at high frequencies, the cross-couple active inductive loads 104 and 105 further increase the gain and equalization of the differential output signal. The high-speed multiplexer 100 provides an equalized differential output signal as output (e.g., to the driver 101) at the differential output node pair (operation 420). The equalized differential output signal corresponds to a result of driving the cross-coupled active inductive load pair using the differential output signal.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A device comprising:
an input stage comprising a set of differential input pairs to receive a set of differential input signals and provide a differential output signal based on the set of differential input signals at a differential output node pair;
an active inductive load pair connected to the input stage, the active inductive load pair equalizing the differential output signal provided at the differential output node pair, the active inductive load pair comprising:
a first active inductive load connected to a first output node of the differential output node pair;
a second active inductive load connected to a second output node of the differential output node pair;
a first capacitor connected between the second active inductive load and the first output node; and
a second capacitor connected between the first active inductive load and the second output node; and
a first bias control element and a second bias control element, the first bias control element and the second bias control element receiving a first bias voltage at a common gate node, the first bias control element being connected to a first drain node, the second bias control element being connected to a second drain node, the first drain node being connected to a drain of a first p-channel field-effect transistor (pFET) device of the first active inductive load, the second drain node being connected to a drain of a second pFET device of the second active inductive load.

2. The device of claim 1, wherein:
the first active inductive load comprises:
the first pFET device connected to the first output node; and
a first resistor connected between a first gate node and the first drain node, the first gate node being connected to a gate of the first pFET device;
the second active inductive load comprises:
the second pFET device connected to the second output node; and
a second resistor connected between a second gate node and the second drain node, the second gate node being connected to a gate of the second pFET device.

3. The device of claim 2, wherein:
the first capacitor is connected between the second gate node and the first output node; and
the second capacitor is connected between the first gate node and the second output node.

4. The device of claim 1, further comprising a third bias control element and a fourth bias control element, the third bias control element and the fourth bias control element receiving a second bias voltage and being connected to a common ground, the third bias control element being connected to the first gate node, the fourth bias control element being connected to the second gate node.

5. The device of claim 1, wherein:
each of the first bias control element and second bias control element comprise a pFET device, and each of the third bias control element and fourth bias control element comprise an nFET device.

6. The device of claim 1, wherein the input stage generates the differential output signal by mixing the set of differential input signals.

7. The device of claim 1, wherein a first differential input pair in the set of differential input pairs comprises a pair of n-channel field-effect transistor (nFET) devices connected to a common ground.

8. The device of claim 7, wherein:
a first nFET device in the pair of nFET devices receives a first input signal, and
a second nFET device in the pair of nFET devices receives an inverse of the first input signal.

9. The device of claim 1, wherein the active inductive load pair forms a cross-coupled pair at high frequency.

10. A method comprising:
receiving a set of differential input signals at an input stage of a multiplexer;
generating, at a differential output node of the multiplexer, a differential output signal based on the set of differential input signals;
equalizing the differential output signal by driving an active inductive load pair using the differential output signal, the equalizing of the differential output signal resulting in an equalized differential output signal, the active inductive load pair comprising:
a first active inductive load connected to a first output node of the differential output node pair;
a second active inductive load connected to a second output node of the differential output node pair; and
a first bias control element and a second bias control element, the first bias control element and the second bias control element receiving a first bias voltage at a common gate node, the first bias control element being connected to a first drain node, the second bias control element being connected to a second drain node, the first drain node being connected to a drain of a first p-channel field-effect transistor (pFET) device of the first active inductive load, the second drain node being connected to a drain of a second pFET device of the second active inductive load; and
providing the equalized differential output signal at the differential output node of the multiplexer.

11. The method of claim 10, wherein the generating of the differential output signal comprises mixing the set of differential input signals at the differential output node.

12. The method of claim 10, wherein the input stage of the multiplexer comprises a set of differential input pairs to receive the set of differential input signals.

13. The method of claim 10, wherein the first active inductive load is crossed-coupled with thee second inductive load by a first cross-coupling capacitor and a second cross-coupling capacitor.

14. The method of claim 13, wherein:
the first cross-coupling capacitor is connected between the second active inductive load and the first output node; and
the second cross-coupling capacitor connected between the first active inductive load and the second output node.

15. The method of claim 14, wherein:
the first active inductive load comprises:
the first pFET device connected to the first output node; and
a first resistor connected between a first gate node and a first drain node, the first gate node being connected to a gate of the first pFET device, the first drain node being connected to a drain of the first pFET device;
the second active inductive load comprises:
the second pFET device connected to the second output node; and
a second resistor connected between a second gate node and a second drain node, the second gate node being connected to a gate of the second pFET device, the second drain node being connected to a drain of the second pFET device.

16. The method of claim 15, wherein:
the first cross-coupling capacitor is connected between the second gate node and the first output node; and
the second cross-coupling capacitor is connected between the first gate node and the second output node.

17. The method of claim 10, wherein:
a first differential input pair in the set of differential input pairs comprises a pair of n-channel field-effect transistor (nFET) devices connected to a common ground;
a first nFET device in the pair of nFET devices receives a first input signal; and
a second nFET device in the pair of nFET devices receives an inverse of the first input signal.

18. A system comprising:
a driver; and
a multiplexer comprising a differential output node connected to a driver input of the driver, the multiplexer further comprising:
a set of differential input pairs to receive a set of differential input signals and provide a differential output signal based on the set of differential input signals at the differential output node pair;
an active inductive load pair connected to the set of differential input pairs, the active inductive load pair equalizing the differential output signal provided at the differential output node pair, the active inductive load pair comprising a first active inductive load crossed-coupled with a second active inductive load by a first cross-coupling capacitor and a second cross-coupling capacitor; and
a first bias control element and a second bias control element, the first bias control element and the second bias control element receiving a first bias voltage at a common gate node, the first bias control element being connected to a first drain node, the second bias control element being connected to a second drain node, the first drain node being connected to a drain of a first p-channel field-effect transistor (pFET) device of the first active inductive load, the second drain node being connected to a drain of a second pFET device of the second active inductive load.

19. The system of claim 18, wherein:
the first active inductive load is connected to a first output node of the differential output node pair;
the first active inductive load comprises:
the pFET device connected to the first output node; and
a first resistor connected between a first gate node and the first drain node, the first gate node being connected to a gate of the first pFET device;
the second active inductive load is connected to a second output node of the differential output node pair;
the second active inductive load comprises:
the second pFET device connected to the second output node; and a second resistor connected between a second gate node and a second drain node, the second gate node being connected to a gate of the second pFET device.

* * * * *